(12) United States Patent
Georgakos et al.

(10) Patent No.: US 7,177,385 B2
(45) Date of Patent: Feb. 13, 2007

(54) SHIFT REGISTER FOR SAFELY PROVIDING A CONFIGURATION BIT

(75) Inventors: Georg Georgakos, Fraunberg (DE); Siegmar Koeppe, Laatzen (DE); Thomas Niedermeier, Rosenheim (DE)

(73) Assignee: Infineon Technologies AG, Munich (DE)

( * ) Notice: Subject to any disclaimer, the term of this patent is extended or adjusted under 35 U.S.C. 154(b) by 85 days.

(21) Appl. No.: 11/004,047

(22) Filed: Dec. 3, 2004

(65) Prior Publication Data

US 2005/0163277 A1 Jul. 28, 2005

(30) Foreign Application Priority Data

Dec. 5, 2003 (DE) ................. 103 56 851

(51) Int. Cl.
*G11C 19/00* (2006.01)
(52) U.S. Cl. ............... 377/80; 377/81; 377/78; 327/202
(58) Field of Classification Search ........ None
See application file for complete search history.

(56) References Cited

U.S. PATENT DOCUMENTS

| | | | |
|---|---|---|---|
| 3,812,476 A | 5/1974 | Cragon | 365/73 |
| 5,132,993 A * | 7/1992 | Nishiura et al. | 377/76 |
| 5,208,833 A * | 5/1993 | Erhart et al. | 375/294 |
| 5,598,120 A * | 1/1997 | Yurash | 327/202 |
| 5,670,901 A * | 9/1997 | Yoshida | 327/18 |
| 6,011,740 A | 1/2000 | Trimberger | 365/211 |
| 6,879,313 B1 * | 4/2005 | Kubota et al. | 345/100 |
| 2003/0120987 A1 | 6/2003 | Savaria et al. | 714/726 |

* cited by examiner

*Primary Examiner*—Tuan T. Lam
(74) *Attorney, Agent, or Firm*—Maginot, Moore & Beck

(57) ABSTRACT

The invention relates to a shift register cell for safely providing a configuration bit having a master latch which can be connected to a serial data input on the shift register cell for the purpose of buffer storing a data bit; a first slave latch which can be connected to the master latch for the purpose of buffer storing the data bit; at least one second slave latch which can be connected to the master latch for the purpose of buffer storing the data bit, and having an evaluation logic unit which outputs the configuration bit on the basis of the data bits which are buffer stored in the master latch and in the slave latches. In addition, the invention provides a shift register for safely providing configuration bits which has a plurality of inventive shift register cells which are connected in series to form a shift register chain.

28 Claims, 5 Drawing Sheets

SHIFT REGISTER FOR SAFELY PROVIDING A CONFIGURATION BIT

BACKGROUND

The invention relates to a shift register for safely providing a configuration bit, particularly a bit from a series of configuration bits which are needed for configuring programmable logic circuits.

In the case of programmable logic circuits, such as in the case of FPGAs (Field Programmable Gate Arrays), particularly high demands are placed on the reliability of the configuration bits. FPGAs are fully programmable by the user ("in the field") and can perform a great number of the logic functions desired by the user, depending on the programming or configuration. FPGAs normally contain configurable logic blocks whose electrical connections are defined by the externally applied configuration bits and thus form a complex logic chip overall.

In commercially available variants of FPGAs, the configuration bits are stored in locally or peripherally arranged SRAMs and continually need to be available as logic levels in order to maintain the appropriately programmed electrical connection which has been set up or interrupted in the FPGA, or the FPGA's functional variant. When turning on or at the start of an operating period for an FPGA, the configuration bits are loaded into the individual SRAM blocks and are then available there over the entire operating period. The fact that the configuration bits need to be individually readable and writable, since each configuration bit represents an electrical connection which has been set up or interrupted in the FPGA, means that the peripheral complexity is very high in the case of this solution. In addition, the logic operation of the FPGA can be defined only when turning on or in the case of a reset or in an offline mode by reloading the SRAMs, but not in the short term, e.g. within one clock cycle.

Since the logic operation of an FPGA is defined by all of the configuration bits, disturbed configuration bits cause the entire programmable chip to malfunction.

With progressing miniaturization, the memory cells are becoming more sensitive toward fault mechanisms. In particular, ionizing radiation can "reprogram" individual SRAM cells when recent submicron technology is used. Frequently, even the potting compound or other materials within the chip contain alpha radiation sources as impurities.

In the event of a malfunction as a result of incorrect configuration bits, a partial configuration update or configuration change then needs to be performed for the memory cells which have been combined to produce an actuatable block or cluster and include a faulty memory cell. Since each memory cell needs to be addressed and have information written to it, a change of configuration is very time-consuming and the FPGA is not operational during this time. During reprogramming, it is also necessary to prevent the logic blocks provided in the FPGA from being active and sometimes connections from being briefly set which, in the extreme case, may result in short circuits between individual outputs.

U.S. Pat. No. 6,011,740 describes an arrangement comprising three latches or memory cells for use as configuration memory in FPGAs, which arrangement allows said FPGAs to be reprogrammed. FIG. 1 shows a corresponding arrangement based on the prior art. Three memory cells or latches MC1, MC2, MC3 connected in series in the circuit are provided, with switches S1, S2, S3 which can be controlled by suitable signals P1, P2, P3 being provided between the latches MC1, MC2, MC3, and the third latch MC3 having an inverter I connected downstream of it. The input of the first latch is connected by means of a controllable switch S4, which is controlled by a control signal P4, to a bit line, for example, which delivers a configuration bit KE which is used for programming. At the output of the second latch MC2, the configuration bit KA is then output continuously to a programming node in an FPGA. A suitable switching sequence for the controllable switches S1, S2, S3, S4 writes different configuration bits to all three latches. In parallel with the continuous output of the configuration bits KA, it is possible to close the switch S4, open the switch S3 and apply a new configuration bit KE (which is different from KA) in order to write said configuration bit to the latch MC1. Opening the switch S4 again and closing the switch S1 "shifts" the memory content of the memory cell MC1 to the cell MC2 and thus changes the configuration bit KA at the output. It is possible to change to the original configuration state again by closing the switch S3, which shifts the memory content of the latch MC3 to the latch MC1, and closing the switch S1, in order to restore the original configuration state. The latches based on the prior art can, as FIG. 2 shows, be connected by two back-to-back connected inverters I1, I2 to form a latch MC, with the input E and the output A respectively being formed by connecting nodes between the inverters I1, I2. Such an embodiment of a latch delivers the inverted level of the input value at its output (as a result of which the annular arrangement in FIG. 1 presupposes the inverter).

Although the circuit arrangement shown in FIG. 1 based on the prior art allows reprogramming of a configuration bit KA which is routed to a programming node in an FPGA, it requires considerable wiring complexity, because each circuit arrangement as shown in FIG. 1 needs to be connected to a bit line for each programming node—or for each configuration bit—and needs to be equipped with the wiring for the controllable switches. In the case of large scale integration and miniaturization in the submicron range, fault mechanisms—such as ionizing radiation (alpha particles)—may additionally alter the latch contents and may thus cause the FPGA to malfunction. In addition, the arrangement of the latches M1, M2, M3 in the form of an annular shift register permits just one change of configuration or one change of configuration bit twice in succession.

It is therefore an object of the present invention to provide a shift register for safely providing configuration bits, and particularly a shift register cell, which requires little complexity in terms of circuitry and permits configuration changes during operation.

SUMMARY

The invention provides a shift register cell having a master latch which can be connected to a serial data input on the shift register cell for the purpose of buffer-storing a data bit, having a first slave latch which can be connected to the master latch for the purpose of buffer-storing the data bit, having at least one second slave latch which can be connected to the master latch for the purpose of buffer-storing the data bit, and having an evaluation logic unit which outputs a configuration bit on the basis of the data bits which are buffer-stored in the master latch and in the slave latches.

The invention also provides a shift register for safely providing configuration bits having a plurality of inventive shift register cells which are connected in series to form a shift register chain.

The idea on which the present invention is based is for the configuration bits to be routed serially through the shift register to the programming nodes in a circuit which is to be configured and for slave latches branched off from the shift register to be provided in the respective shift register cells for the purpose of buffer-storing the configuration bits.

In line with the invention, the evaluation logic unit can output the data bits which are buffer-stored in a main section of the shift register cell—or of the shift register formed from a chain of inventive shift register cells—(which main section is formed from the master latches and the first slave latches), or the data bits which are buffer-stored in the branched second slave latches, as a configuration bit—or configuration bits in the case of the shift register chain—, particularly to a programming node in a circuit which is to be configured.

The inventive shift register makes it possible to change the configuration bits which are present at programming nodes in a very short time, i.e. one clock cycle, and hence to alter the logic operations of the programmable logic circuit. Secondly, redundant storage of the configuration bits in the master latches, the first slave latches and further slave latches allows the reliability of the configuration bits which are output by the evaluation logic units to be increased, because the respective evaluation logic unit takes a majority decision, for example. A logic chip programmed using the configuration bits provided in accordance with the invention is therefore more resistant toward external perturbing influences than when using circuit arrangements based on the prior art.

In one preferred embodiment of the inventive shift register cell, two slave latches are provided. Exactly two slave latches represent minimal additional circuit complexity as compared with a shift register unit comprising just one master latch and one slave latch, and nevertheless afford the opportunity to change over between configuration bits stored in the slave latches.

Advantageously, the data bits which are buffer-stored in the master latch and in the slave latches may be used by the respective evaluation logic unit to make an absolute majority decision; the evaluation logic also outputs a corresponding configuration bit. Accordingly, the evaluation logic unit outputs a configuration bit with a particular logic value if at least two data bits which are buffer-stored in the latches have this particular logic value.

In a further preferred embodiment, the respective evaluation logic unit in an inventive shift register cell outputs one of the data bits which are buffer-stored in the respective slave latches as the configuration bit on the basis of a global control signal. When the evaluation logic unit is operating as a multiplexer in this manner, the inventive shift register cell can be used particularly advantageously in a shift register formed by a chain of shift register cells and is used for easily and quickly changing over between configuration data which, in the form of the configuration bits, determine the operation of a connected programmable logic circuit.

In a further preferred embodiment of the shift register cell, the respective evaluation logic unit outputs an error indicator bit if not all of the data bits which are buffer-stored in the latches in the shift register cell have the same logic value. As a result of the output of the error indicator bit, it is possible to identify if an external influence has altered the memory content of one or more latches incorrectly. The situation is thus advantageously identified when, by way of example, radiated interference, voltage spikes or alpha particles which have their sources in or close to the chip have altered the logic state of a latch.

The error indicator bits are preferably read and identified by a data processing unit from the shift register which is formed from the chain of inventive shift register cells, as a result of which the occurrence of a bit error in the shift register is indicated. Preferably, the error indicator bits which are output by the respective evaluation logic units in the shift register cells are logically combined by an OR logic circuit to form a global error indicator bit.

In yet another preferred embodiment of the invention, the respective evaluation logic unit outputs a correction bit to one of the latches whose buffer-stored data bit has a data bit value which differs from the data bit values of the other buffer-stored data bits in the other latches in the respective shift register cell. In this case, the correction bit which is output by the evaluation logic unit overwrites the erroneous data bit, which corrects the bit error.

Alternatively, the evaluation logic unit outputs a correction bit to all of the latches in the respective shift register cell if at least one buffer-stored data bit has a data bit value which differs from the data bit values of the buffer-stored data bits in the other latches in the shift register cell, the correction bit which is output by the evaluation logic unit corresponding to the configuration bit determined using the absolute majority decision.

This automatic correction of bit errors in the shift register increases the reliability of the configuration bits.

In one particularly preferred embodiment of the inventive shift register, the data processing unit identifies a single bit error which has occurred temporarily if completed correction of the erroneous data bit in a respective shift register cell by overwriting with the correction bit is followed by the error indicator bit being reset or erased by the respective evaluation logic unit.

In one advantageous development, the data processing unit identifies a hardware error if completed correction of the erroneous data bit by overwriting with the correction bit is followed by the error indicator bit also continuing to be read from the shift register. The identification and overwriting of temporary single bit errors and identification of hardware errors have the advantage that temporary errors can be handled in suitable fashion, e.g. by overwriting them again. Particularly in the case of critical applications, however, hardware errors require more thorough measures in the shift register or in a circuit which is to be configured or which is to be programmed using the configuration bits.

In a further preferred embodiment of the inventive shift register cell, the respective first slave latch is connected to a serial data output on the shift register cell. This allows the data which have been written serially to the master latch and to the first slave latch to be routed to further shift register cells via the serial data output and hence allows a shift register chain to be formed. Advantageously, the inventive shift register formed from the shift register chain in this manner is then also used to transport the configuration data or configuration bits to the programming nodes in a circuit which is to be configured.

Advantageously, the latches are in the form of static latches so that the buffer-stored bits and configuration bits are constantly available. Preferably, the latches can be switched by means of controllable switches, the switches being transmission gates, $C^2MOS$ gates and/or transistors, for example.

In one particularly preferred development of the inventive shift register cell, a multiplexer is also provided which has a first input, which is coupled to the evaluation logic unit for the purpose of receiving the configuration bit which is output, which has a second input, which is connected to the first slave latch, at least one third input, which is connected to the second slave latch, and which has a fourth input, to which a constant logic initialization value is applied. One of the input signals is output at an output on the multiplexer.

The use of the multiplexer has the advantage that arbitrary selections can be made between various, buffer-stored bits or configuration bits, and also a constant logic initialization value can be output. The initialization value is advantageously chosen such that if it is applied to the programming nodes in the circuit which is to be configured, the circuit to be configured is put into a particularly safe and/or power-saving mode. This has the advantage that if new configuration data are read into the shift register chain formed from the shift register cells or into the shift register, the circuit to be configured is put into a defined, particularly advantageous state, e.g. a particularly power-saving, low-power-loss state.

The multiplexer may advantageously be changed over between the four inputs by a global control signal.

In a further preferred development of the inventive shift register, a shift register controller clocked by a clock signal is provided which actuates the switches in the shift register cells on the basis of an operating phase control signal.

The shift register controller may advantageously switch between at least three different operating phases using the operating phase control signal. In this context, a first phase, the write operating phase, provides for configuration data to be written as data bits to the master latches and to the first slave latches in the shift register cells. In a second operating phase, the transfer operating phase, the data bits which have been written to the master latches are written to the respective second slave latches in the shift register cells. In a third operating phase, the provision operating phase, the latches are isolated from one another, and the evaluation logic units in the shift register cells output the configuration bits, on the basis of the data bits which are buffer-stored in the latches in the respective shift register cell, to programming nodes in a circuit which is to be configured. The execution in three operating phases has the advantage that the operating phases can be matched to a clock rate and hence a change of configuration or a change of configuration bit which is output by the evaluation logic unit can be performed quickly and efficiently. Advantageously, the clock signal can be turned off during the provision operating phase, since operation of a connected circuit which is to be configured requires only that the configuration data be continuously available in the form of the configuration bits.

Further advantageous refinements and developments of the invention are the subject matter of the subclaims and of the description with reference to the drawing.

BRIEF DESCRIPTION OF THE DRAWINGS

The invention is explained in more detail below with reference to the schematic figures and exemplary embodiments. In the figures.

In all of the figures, elements which are the same or have the same function have been provided with the same reference symbols—unless indicated otherwise.

DESCRIPTION

The text below explains the manner of operation of the invention by way of example using noninverting switches and latches. Accordingly, a noninverting switch always switches through the logic signal level which is applied to the input, and a latch delivers the same logic signal level applied to the input, said signal level corresponding to a data bit, as a buffer-stored bit with the same logic signal level at its output.

Figure 1:
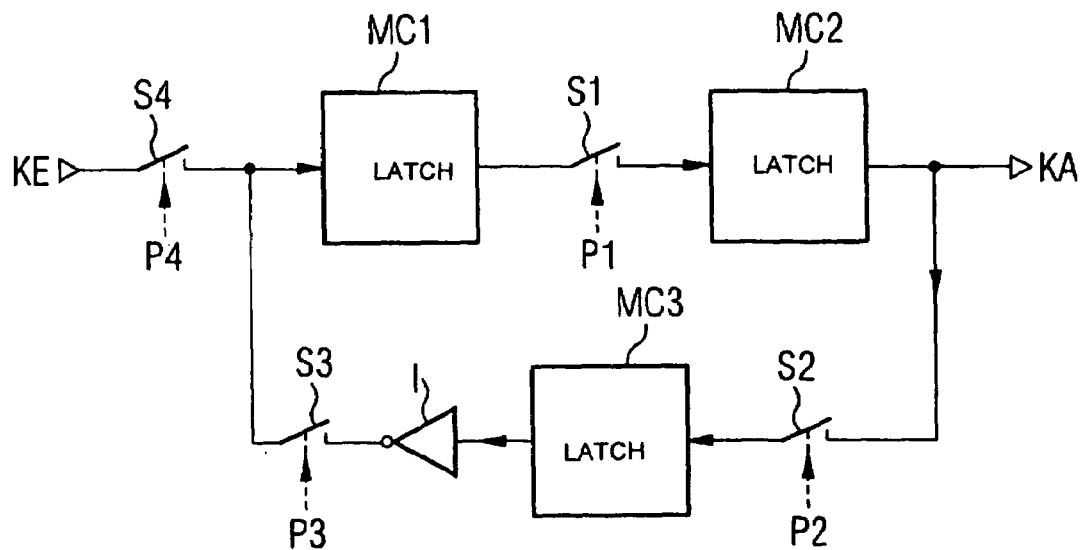
FIG. 1 shows a shift register element for providing configuration bits based on the prior art.
Figure 2:
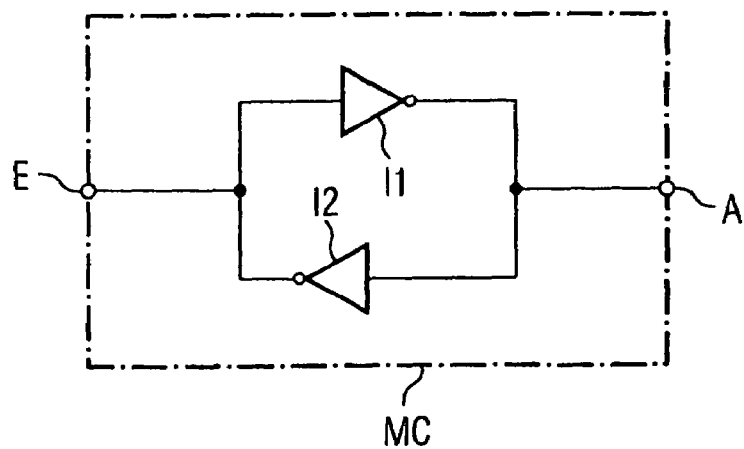
FIG. 2 shows a latch circuit based on the prior art.
Figure 3:
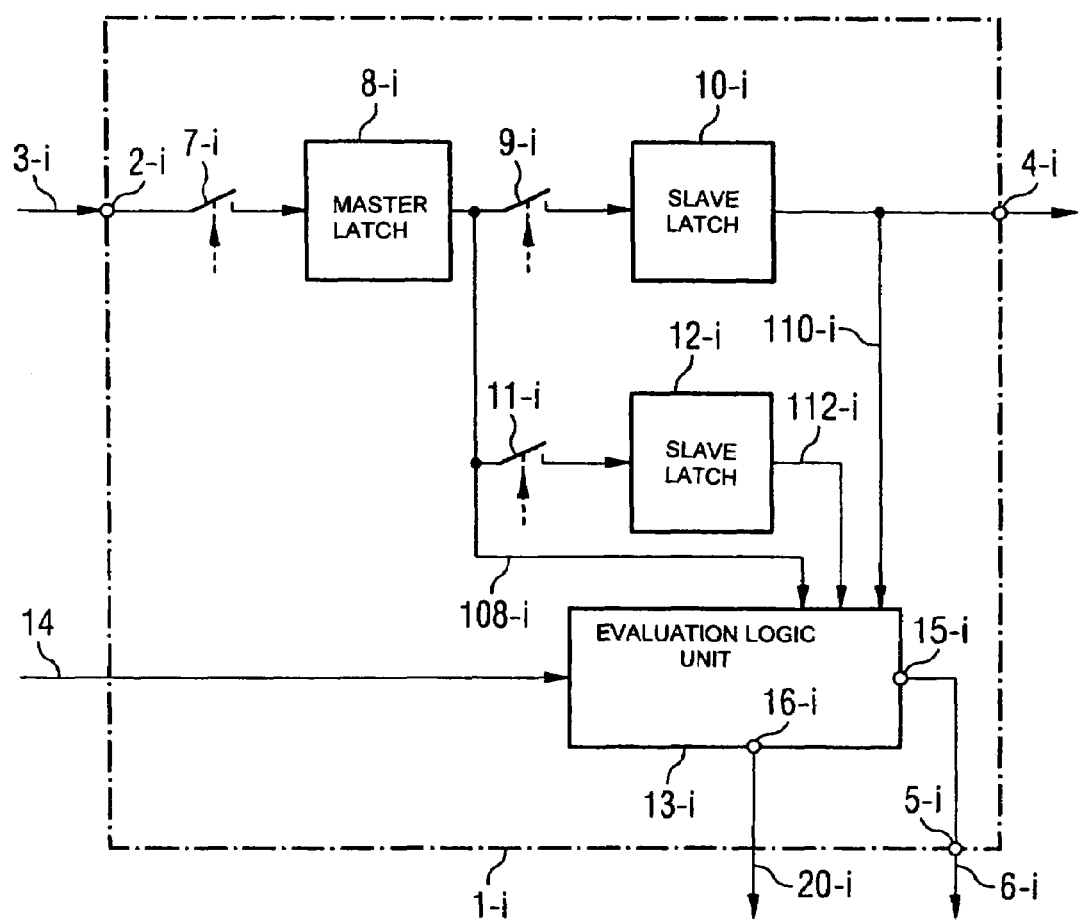
FIG. 3 shows a first embodiment of the inventive shift register cell.

FIG. 3 shows a first embodiment of the inventive shift register cell 1-$i$ with a serial data input 2-$i$ for receiving serial configuration data or bits 3-$i$, an output 4-$i$ at which the serial configuration data 3-$i$ are output again, and with an output 5-$i$ at which a configuration bit 6-$i$ is output. Coupled to the input 2-$i$ via a controllable switch 7-$i$ is the master latch 8-$i$, to which a first slave latch 10-$i$ is in turn coupled via a controllable switch 9-$i$. The first slave latch 10-$i$ is coupled to the output 4-$i$ of the shift register cell 1-$i$. A second slave latch 12-$i$ is likewise coupled via a controllable switch 11-$i$ to the output of the master latches 8-$i$. An evaluation logic unit 13-$i$ is coupled to the master latch 8-$i$, to the first slave latch 10-$i$ and to the second slave latch 12-$i$ via lines 108-$i$, 110-$i$, 112-$i$ and delivers the configuration bit 6-$i$ to the output 5-$i$ of the shift register cell 1-$i$ on the basis of the data bits which are present in the latches 8-$i$, 10-$i$, 12-$i$ and a global control signal 14 at a first output 15-$i$. In addition, the evaluation logic unit 13-$i$ has an output 16-$i$ for outputting an error indicator bit 20-$i$.

The manner of operation is first explained with reference to a single shift register cell 1-$i$. The statements likewise apply in an appropriate sense to a chain of shift register cells 1-$i$. First, data bits 3-$i$ are read into the master latch 8-$i$ and into the first slave latch 10-$i$ via the complementarily connected switches 7, 9, e.g. cyclically by a global controller (not shown here). When a shift register 17 is in the form of a shift register chain 1, 100 with series-connected inventive shift register cells 1—1, . . . 1-N, as described in FIG. 4 below, the configuration data 3 are read into the main section of the register chain 1, 100, which section is formed from the master latches and the first slave latches 8-1, . . . 8-N, 10-1, . . . 10-N. If the switch 11-$i$ connected upstream of the second slave latch 12-$i$ is then closed, the data bit which is buffer-stored in the master latch 8-$i$ is transferred to the second slave latch 12-$i$. Hence, ideally, i.e. without external interfering influences, the latches 8-$i$, 10-$i$, 12-$i$ contain a buffer-stored data bit with the same logic level after the switches 7-$i$, 9-$i$, 11-$i$ have been opened. These buffer-stored bits are available to the evaluation logic unit 13-$i$ via the lines 108-$i$, 110-$i$, 112-$i$. The evaluation logic unit 13-$i$ compares the buffer-stored bits and provides the logic level which is present in the majority to the output of the shift register cell 5-$i$ via an output 15-$i$ as a configuration bit 6-$i$, e.g. to a programming node. In this case, it is possible to dispense with the global control signal 14.

In one alternative embodiment, the evaluation logic unit 13-$i$ is configured by a global control signal 14 as a multiplexer such that, without making a majority decision or a comparison, the level which is present on one of the two lines 110-$i$, 112-$i$ which connect the evaluation logic unit 13-$i$ to the slave latches 10-$i$, 12-$i$ is always available at its output 15-$i$ and is thus supplied to the programming node connected to the output 5-$i$ as a configuration bit 6-$i$. With such setting of the evaluation logic unit 13-$i$, the main section of the shift register cell 1-$i$ or of the shift register 1, comprising the master latch 8-$i$ and the first slave latch 10-$i$ and the switches 7-$i$, 9-$i$, serves as a means of transport for the configuration data stream 3 comprising individual bits 3-1, . . . 3-N, and said configuration data stream is output at the output 4-$i$ as output data. In this case, the configuration data 3 or the input data bit 3-$i$ is/are buffer-stored in the second slave latch 12-$i$ via the temporarily closed switch 11-$i$, and the evaluation logic unit 13-$i$ always routes the bit which is present on the line 112-$i$, which connects the second slave latch 12-$i$ to the evaluation logic unit 13-$i$, to the output 5-$i$. The evaluation logic unit 13-$i$ then permits changeover between the various buffer-stored bits which are present on the lines 110-$i$, 112-$i$, even when the switches 7-$i$, 11-$i$ are open and as a result of suitable prior shifting of the input data bit 3-$i$ into the master and slave latches 8-$i$, 10-$i$, 12-$i$ using the switches 7-$i$, 9-$i$, 11-$i$. It is thus a simple matter for the inventive shift register cell 1-$i$ to switch back and forth between various configurations in line with the buffer-stored data bits. In addition, the configuration of the evaluation logic unit 13-$i$ as a multiplexer affords the advantage that firstly, when the switch 11-$i$ is open, the second slave latch 12-$i$ is isolated and a bit is buffer-stored for use as a configuration bit 6-$i$, as a result of which the operation of a programmable circuit 18 connected to the shift register cell 1-$i$ is safeguarded. Secondly, it is simultaneously possible for new configuration data 3 to be read into the main section without interrupting the operation of the connected programmable circuit 18.

The evaluation logic unit 13-$i$ outputs an error indicator bit 20-$i$ if the logic levels on the lines 108-$i$, 110-$i$, 112-$i$ which connect the latches 8-$i$, 10-$i$, 12-$i$ to the evaluation logic unit 13-$i$ are not the same. The operation of the error indicator bit 20-$i$ is explained in more detail in the second embodiment of the shift register cell 1-$i$ or of a correspondingly formed shift register 17.

Figure 4:
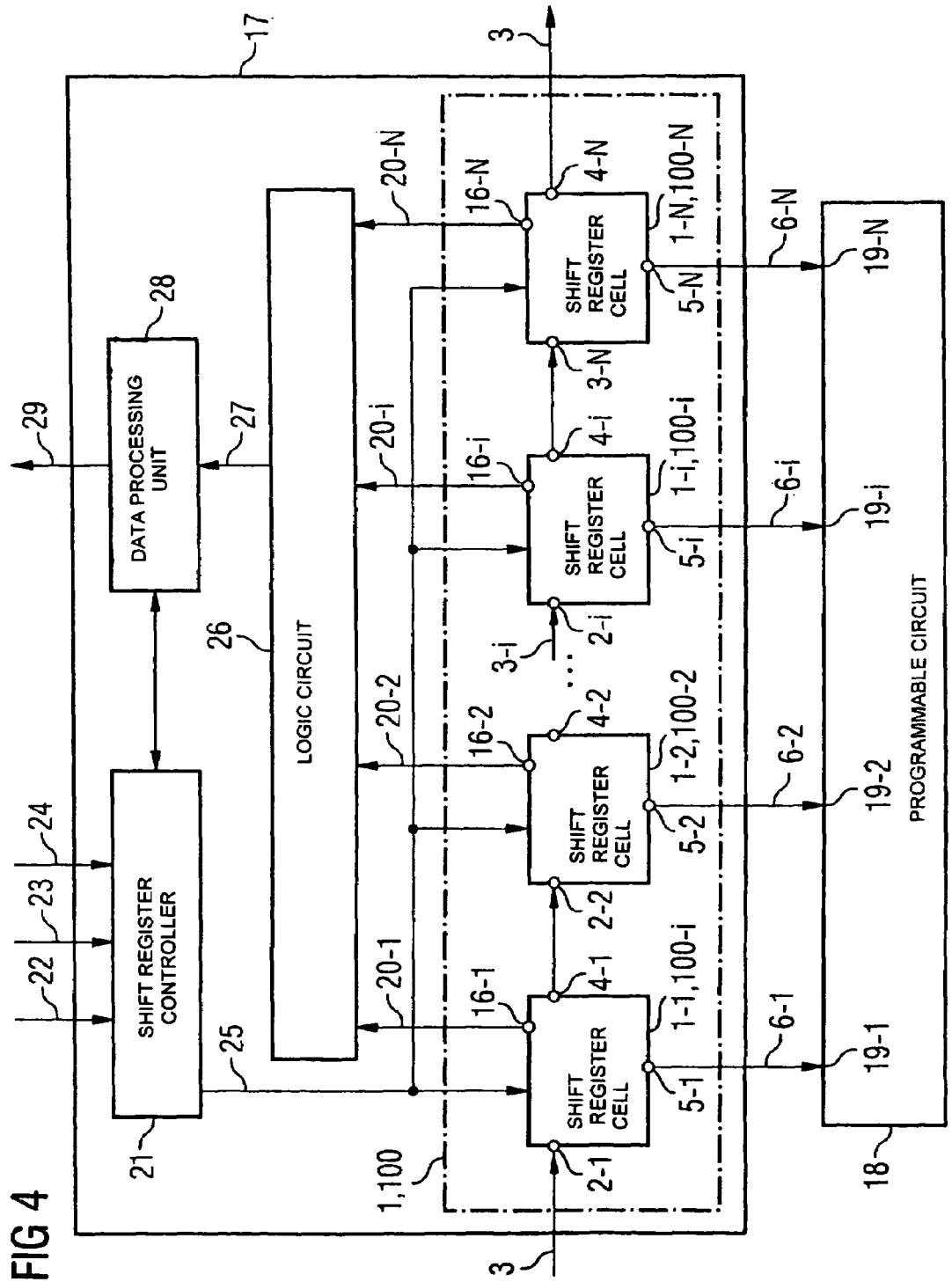
FIG. 4 shows a block diagram of an inventive shift register coupled to an FPGA as a circuit which is to be configured.

FIG. 4 shows a block diagram of an inventive shift register 17 comprising series-connected shift register cells 1—1, . . . 1-N (or 100-1, . . . 100-N in the case of a second embodiment of the shift register cells, where the explanations of the manner of operation of the shift register 17 apply synonymously to the second embodiment), and a programmable circuit 18 which is to be configured, whose programming nodes 19-1, . . . 19-N have the configuration bits 6-1, . . . 6-N applied to them. The configuration bits 6-1, . . . 6-N are provided at the outputs 5-1, . . . 5-N of the inventive shift register cells 1—1, . . . 1-N, the shift register cells 1—1, . . . 1-N being interconnected to form a shift register chain 1, 100. In addition, each shift register cell 1—1, . . . 1-N has a respective output 16-1, . . . 16-N which is used for outputting an error indicator bit 20-1, . . . 20-N. Each shift register cell 1—1, . . . 1-N has a serial data input 2-1, . . . 2-N and a serial data output 4-1, . . . 4-N, the shift register cells 1—1, . . . 1-N being connected in series to form the shift register chain 1, 100, so that the output 4-1 . . . 4-N-1 of a shift register cell 1—1, . . . 1-N-1 is respectively coupled to the input 2—2, . . . 2-N of the next shift register cell 1-2, . . . 1-N. On the input side, the serially provided configuration data 3 are routed to the input 2-1 of a first shift register cell 1—1 and are output again at the output 4-N of the last shift register cell 1-N in the shift register chain 1, 100 as output data 3.

A shift register controller 21 is provided which receives a clock signal 22, a global control signal 23 and the operating phase control signal 24 and which is coupled to the shift register cells 1, . . . 1-N via suitable control lines 25 (which are shown only symbolically in the figure as a single line). The shift register controller 21 controls the controllable switches in the shift register cells 1, . . . 1-N, the respective evaluation logic units 13-1, . . . 13-N within the respective shift register cell 1—1, . . . 1-N and further operating cycles in the shift register cells 1, . . . 1-N.

In addition, the shift register 17 has an OR logic circuit 26 which logically combines the error indicator bits 20-1, . . . 20-N to form a global error indicator bit 27. The global error indicator bit 27 is read and evaluated by a data processing unit 28 which is coupled to the shift register controller 21. The data processing unit 28 accordingly outputs an error message 29.

Figure 5:
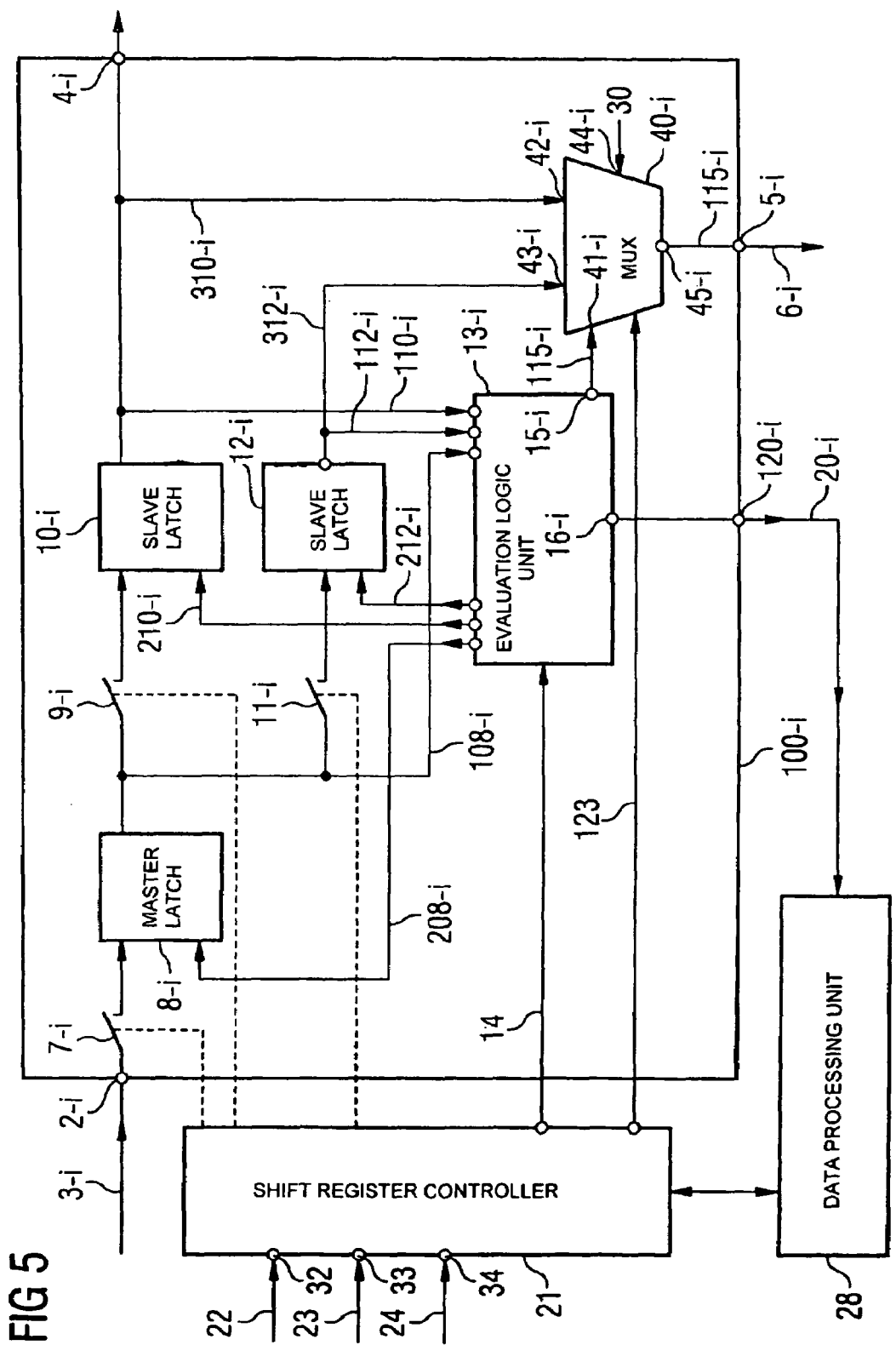
FIG. 5 shows a second embodiment of the inventive shift register cell.

FIG. 5 shows a second embodiment of the inventive shift register cell 100-$i$ for use in the shift register 17 which is described in FIG. 4. The statements below are to be understood as being representative of all of the shift register cells 100-1, . . . 100-N in the shift register 17.

This second embodiment of the shift register cell 100-$i$ essentially has an inventive circuit comprising three latches 8-$i$, 10-$i$, 12-$i$ in line with the first embodiment 1-$i$ of the shift register cell, the evaluation logic unit 13-$i$ additionally being coupled via lines 208-$i$, 210-$i$, 212-$i$ to the inputs of the latches 8-$i$, 10-$i$, 12-$i$, which are preferably in static form. The switches 7-$i$, 9-$i$, 11-$i$ connected upstream of the latches 8-$i$, 10-$i$, 12-$i$ are controlled by a clocked global shift register controller 21 which receives the clock signal 22 via a first input 32, the global control signal 23 via a second input 33 and also the operating phase control signal 24 via a third input 34. On the basis of the clock signal 22 and the operating phase control signal 24, the shift register controller 21 coordinates the switching of the controllable switches 7-$i$, 9-$i$, 11-$i$ connected upstream of the latches 8-$i$, 10-$i$, 12-$i$ in order to initiate the three operating phases which are the write operating phase, the transfer operating phase and the provision operating phase. In this case, the shift register controller 21 controls all of the shift register cells 1—1, . . . 1-N, 100-1, . . . 100-N provided in the shift register 17 which is shown in FIG. 5 simultaneously.

In addition, the second embodiment of the inventive shift register cell 100-$i$ has a multiplexer 40-$i$ whose first input 41-$i$ is connected via a line 115-$i$ to the output 15-$i$ of the evaluation logic unit 13-$i$ (which output has a configuration bit applied to it in line with an evaluation by the evaluation logic unit 13-$i$ taking into account the latch contents or buffer-stored bits in the latches 8-$i$, 10-$i$, 12-$i$), whose second input 42-$i$ is connected to the output of the first slave latch 10-$i$ via a second line 310-$i$, and whose third input 43-$i$ is connected to the output of the second slave latch 12-$i$ via a line 312-$i$. In addition, the multiplexer 40-$i$ is coupled via a line to the shift register controller 21, which delivers a control signal 123 for the multiplexer 40-$i$. The multiplexer 40-$i$ has a fourth input 44-$i$ for applying a constant initialization signal 30. The initialization signal 30 has a predefined level and can be applied externally or can be generated from internal supply voltages or else can be delivered by the shift register controller 21, for example. The multiplexer 40-$i$ is controlled by the shift register controller 21 using the control signal 123 and connects one of its four inputs 41-$i$, 42-$i$, 43-$i$, 44-$i$ to the output 45-$i$. Hence, in line with the control signal 123, alternatively the bit which is output by the evaluation logic 13-$i$, the bit stored in the first slave latch 10-$i$, the bit stored in the second slave latch 12-$i$ or the logic initialization value 30 is switched through to the output 45-$i$ and is output via a line 116-$i$ to the output 5-$i$ of the inventive shift register cell 100-$i$ as a configuration bit 6-$i$.

The shift register 100 or the shift register cell 100-$i$ is operated in three operating phases which are initiated by the global shift register controller 21 in line with the operating phase control signal 24.

In the first write operating phase, a data bit is written to the master latch 8-$i$ and to the first slave latch 10-$i$ or is forwarded in the shift register 100 to the downstream shift register cells 100-$i$+1 until all of the data 3 required for a programmable circuit 18 which is to be configured have been written to the shift register chain 100. This is achieved through complementary switching of the switches 7-$i$, 9-$i$ connected upstream of the master latch 8-$i$ and of the first slave latch 10-$i$ by the shift register controller 21. The switch 11-$i$ connected upstream of the second slave latch 12-$i$ is opened during the write operating phase. In addition, during the first write operating phase, the multiplexer 40-$i$ is configured by means of the control signal 123 such that a constant logic initialization value 30 is connected to its output 45-$i$ as a configuration bit 6-$i$. This initialization value 30 which is now present at the programming node 19-$i$ in the programmable circuit 18 which is to be configured (see also FIG. 4) puts the provided circuit 18 which is to be configured into a particularly safe mode in which little power is consumed and hence the circuit 18 contains defined internal node potentials.

Since the shift register cells 100-1, . . . 100-N can be connected to form a shift register chain 100 as shown in FIG. 4, and hence a series of configuration bits 3-1, . . . 3-N passes through the main section, comprising master latches 8-1, . . . 8-N and first slave latches 10-1, . . . 10-N, under clock control, only the predefined initialization value 30 is present in the form of configuration bits 6-1, . . . 6-N at the programming nodes during this first write phase.

In a second transfer operating phase, which lasts a minimum of just one half-cycle, at least the switch 7-$i$ connected upstream of the master latch 8-$i$ is opened and the switch 11-$i$ connected upstream of the second slave latch 12-$i$ is temporarily closed. Hence, the memory content of the master latch 8-$i$ is transferred to the second slave latch 12-$i$. In this second operating phase, the multiplexer 40-$i$ delivers the level which is present in the first slave latch 10-$i$ as a configuration bit 6-$i$ at its output 45-$i$ in line with the control signal 123. At the end of the transfer operating phase, bits having the same logic levels are buffer-stored in all three latches 8-$i$, 10-$i$, 12-$i$.

In the third provision operating phase, all three switches 7-$i$, 9-$i$, 11-$i$ connected upstream of the latches 8-$i$, 10-$i$, 12-$i$ are opened and hence the latches 8-$i$, 10-$i$, 12-$i$ are fully isolated from one another. The evaluation logic unit 13-$i$ monitors the bits which are buffer-stored in the latches 8-$i$, 10-$i$, 12-$i$. In addition, the evaluation logic unit 13-$i$ delivers, at one of its outputs 15-$i$, a bit state via the line 115-$i$ to one of the inputs 41-$i$ of the multiplexer 40-$i$. In this provision mode, the multiplexer 40-$i$ switches through the signal delivered by the evaluation logic unit 13-$i$ to a programming node 19-$i$ (see FIG. 4) as a configuration bit 6-$i$. The evaluation logic unit 13-$i$ uses a majority decision about the bits buffer-stored in the latches 8-$i$, 10-$i$, 12-$i$ to decide what logic level at the output 15-$i$ of the evaluation logic unit 13-$i$ is supplied to the multiplexer 40-$i$. If an external disturbance has altered the memory content of one of the latches 8-$i$, 10-$i$, 12-$i$ during the operating mode or during the provision operating phase, the evaluation logic unit 13-$i$ indicates this by outputting, at its output 16-$i$, an error indicator bit 20-$i$ to an output 120-$i$ on the shift register cell 100-$i$, and the error indicator bit 20-$i$ is read by a global data processing unit 28, which is also coupled to the shift register controller 21. The data processing unit 28 may be connected directly to the connections 16-1, . . . 16-N of the shift register cells 100-1, . . . 100-N, or preferably, as FIG. 4 shows, a global error indicator bit 27 from the ORed error bits 20-1, . . . 20-N in all of the shift register cells 1—1, . . . 1-N, 100-1, . . . 100-N concatenated in the shift register 17.

If the evaluation logic unit 13-$i$ has identified a bit error of this type, the shift register controller 21 sends a control signal 14 to the evaluation logic unit 13-$i$, which gives the latter permission to access the latches via the lines 208-$i$, 210-$i$, 212-$i$. The control signal may actuate a single shift register cell 100-$i$ or, as a global control signal 14, may grant correction authorization to all evaluation logic units 13-1, . . . 13-N which are present in the shift register cells 1—1, . . . 1-N, 100-1, . . . 100-N in the shift register chain 1, 100. The evaluation logic unit 13-$i$ then corrects the erroneous memory content of the faulty latch 8-$i$, 10-$i$, 12-$i$ by using one of the correction lines 208-$i$, 210-$i$, 212-$i$ to overwrite the respective latch content with the logic level which is provided at the output 15-$i$ of the evaluation logic unit 13-$i$. In a simplified correction operation, the evaluation logic unit 13-$i$ overwrites all of the latches 8$i$, 10-$i$, 12-$i$ with the logic level which is present in the majority in the latches 8-$i$, 10-$i$, 12-$i$.

An external data processing unit 28 is able to identify whether there is a temporary single bit error, namely if the error indicator bit 20-$i$ is reset by the evaluation logic unit 13-$i$ after the correction operation. Normally, the correction operation or the overwriting of an incorrect bit with a correction bit takes just one clock cycle. Hence, an error indicator bit 20-$i$ which has been set over a plurality of clock cycles signifies that a hardware error has occurred. By way of example, one of the latches 8-$i$, 10-$i$, 12-$i$ may be totally faulty in this case. A data processing unit 28 can then take suitable measures in coordination with the shift register controller 21. Its correction measures therefore mean that the inventive shift register 17, which is formed from the inventive shift register cells 100-1, . . . 100-N, always delivers the desired configuration bit(s) 6-1, . . . 6-N permanently and reliably to programming nodes 19-1, . . . 19-N in a circuit 18 which is to be configured.

The inventive shift register cell 100-$i$ also allows a special operating mode, differing from the aforementioned provision operating phase, in which the switch 11-$i$ connected upstream of the second slave latch 12-$i$ is open after the write and transfer operating phase, and the multiplexer 40-$i$ switches through only the latch content of the second slave latch 12-$i$ as a configuration bit 6-$i$ to a programming node 19. At the same time, new configuration data 3 are read cyclically into the latches 8-1, 10-$i$ which form the main section of the shift register chain 1, 100 in the inventive shift register 17 and then the shift register cells 1—1, . . . 1-N, 100-1, . . . 100-N are isolated from one another by opening at least the switch 7-1, . . . 7-N which is connected upstream of the master latch(es) 8-1, . . . 8-N. That is to say that the multiplexer 40-$i$ can switch between various configuration bits which are stored in the first slave latch 10-$i$ or in the second slave latch 12-$i$ and switches through the corresponding latch contents as a configuration bit 6-$i$ to a programming node 19-$i$. In this special operating mode, the bit delivered by the evaluation logic unit 13-$i$ is ignored. Rather, the configuration of the programmable circuit 18 connected to the programming node can be altered within one clock cycle. It is thus possible to switch back and forth repeatedly between various configurations of the connected programmable circuit 18, and furthermore quickly within just one clock cycle. Reprogramming or selection is in turn determined by the global control signal 123 from the shift register controller 21, which control signal controls the multiplexer 40-$i$.

Figure 6:
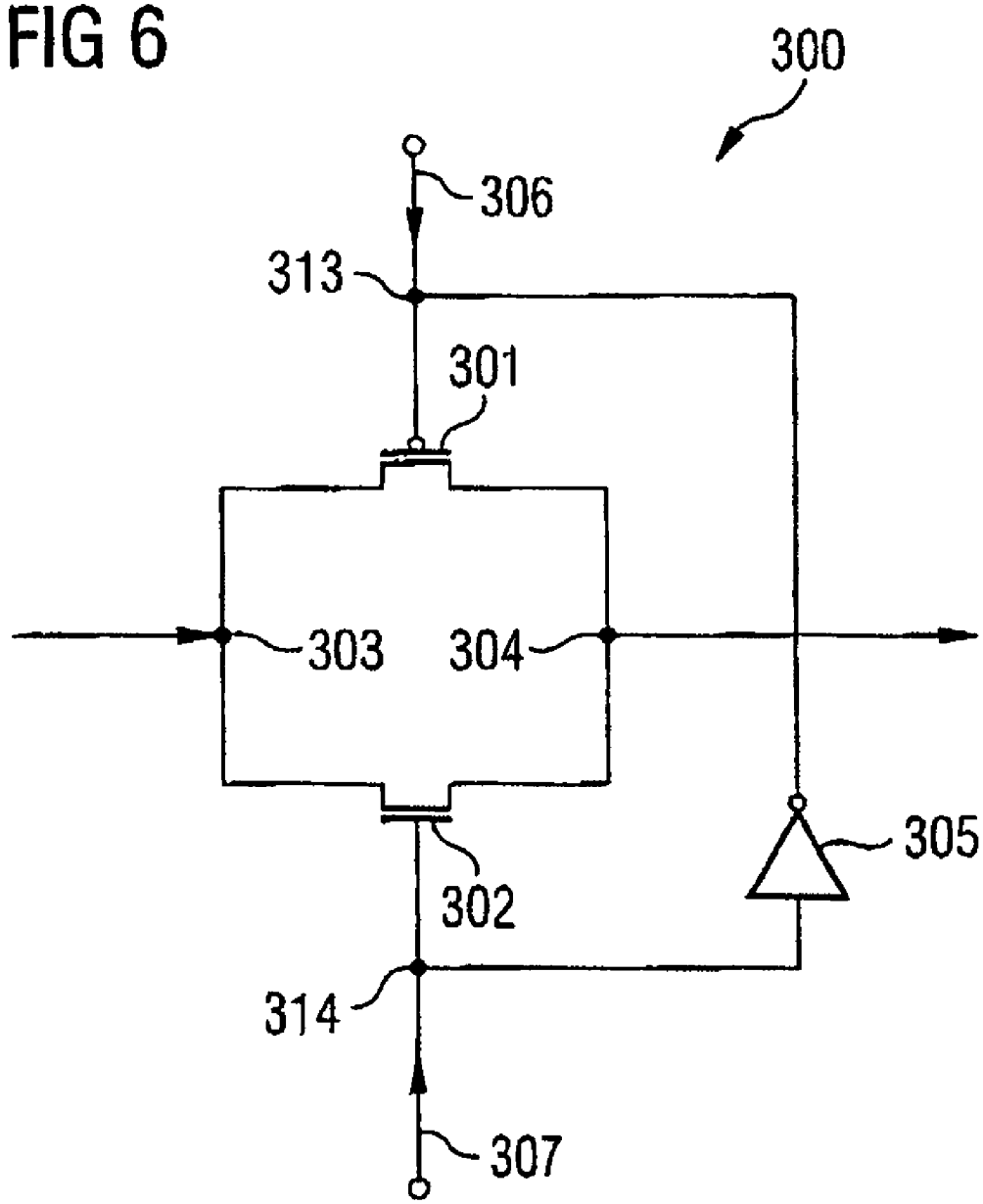
FIG. 6 shows a transmission gate for use in the inventive shift register cells.

FIG. 6 shows, as an example, a transmission gate 300 which can be used as a controllable switch in the inventive shift register cells 1—1, . . . 1-N, 100-1, . . . 100-N. The transmission gate 300 has two complementary MOS transistors 301, 302 whose controllable paths are connected in parallel between two line nodes 303, 304, and the gate connections are connected to one another via an inverter 305. The controllable paths between the two circuit nodes thus form a switched path which can be connected to the gate connections 313, 314 of the complementary MOS transistors 301, 302 by applying two complementary control or switching signals 306, 307. In line with the invention, the complementary switching signals 306, 307 can be provided as clock signals by the shift register controller 21, in which case the inverter 305 is dispensed with.

Although the present invention has been described above with reference to preferred exemplary embodiments, it is not limited thereto, but rather can be modified in multifarious ways. The invention is thus not limited to the specific design of the controllable switches, latches, or number of latches shown in the preceding figures. Rather, the controllable switches can be provided in multifarious ways, e.g. including by switching transistors or C²MOS gates. The person skilled in the art is likewise familiar with further possible embodiments of static latches which are used in the inventive shift register.

Although the shift register cells and shift register chains of the invention have been explained with reference to noninverting switches and latches which, when switching or buffer-storing data signals and data bits, leave the logic levels thereof unchanged, the basic idea of the invention can likewise be implemented using inverting switching and/or storage elements. In particular, the operation of the evaluation logic unit, of the data processing unit and of the shift register controller can be matched to the needs of the particular features of the switching and/or storage elements.

In particular, the use of the shift register for providing a configuration bit does not need to be limited to FPGAs. Rather, the invention is used to provide configuration bits whenever permanent and safe access to data bits is required. Besides FPGAs, this may also be the case with adaptive, digital filters, for example, and the configuration bits represent filter coefficients.

In addition, the invention is not limited to the provision of single configuration bits, but rather also delivers safe configuration bit sequences or configuration words by interconnecting single shift register cells based on the invention to form a shift register chain.

Inventive shift register cells and chains can also be used in parallel and can thus simultaneously deliver independent configuration data components, for example.

LIST OF REFERENCE SYMBOLS

KE Configuration bit for bit line
KA Configuration bit on FPGA
MC1, MC2, MC3 Latches
S1, S2, S3, S4 Controllable switches
P1, P2, P3, P4 Control signals
E Input
A Output
MC Latch
I, I1, I2 Inverter
1, 100 Shift register chain
1—1-1-N Shift register cell
100-1–100-N Shift register cell
2-1–2-N Data input
3 Configuration data
3-1–3-N Configuration data bit
4-1–4-N Output
5-1–5-N Output
6-1–6-N Configuration bits
7-1–7-N Controllable switch
9-1–9-N Controllable switch
11-1–11-N Controllable switch
8-1–8-N Master latch
10-1–10-N Slave latch
12-1–12-N Slave latch
13-1–13-N Evaluation logic unit
14 Control signal
15-1–15-N Output
16-1–16-N Output
18 Circuit to be configured
19-1–19-N Programming node
20-1–20-N Error indicator bit
21 Shift register controller
22 Clock signal
23 Global control signal
24 Operating phase control signal
25 Control lines
26 OR logic circuit
27 Global error indicator bit
28 Data processing unit
29 Error message
30 Initialization value
33, 33, 34 Input
40-1–40-N Multiplexer
41-1–41-N Input of the multiplexer
42-1–42-N Input of the multiplexer
43-1–43-N Input of the multiplexer
44-1–44-N Input of the multiplexer
45-1–45-N Output of the multiplexer
105-1–105-N Line
108-1–108-N Line
110-1–110-N Line
112-1–112-N Line
115-1–115-N Line
123 Control signal
208-1–208-N Line
210-1–210-N Line
212-1–212-N Line
300 Transmission gate
301, 302 NOS transistor
303, 304 Line node
305 Inverter
306, 307 Switching signal
310-1–310-N Line
312-1–312-N Line
313, 314 Gate connection

The invention claimed is:

1. A shift register cell operable to safely provide a configuration bit, the shift register cell comprising:
   (a) a master latch connected to a serial data input of the shift register cell via a first controllable switch, the master latch operable to buffer store a master latch data bit;

(b) a first slave latch connected to an output of the master latch via a second controllable switch, the first slave latch operable to buffer store a first slave latch data bit;
(c) at least one second slave latch connected via at least one third controllable switch to the output of the master latch, the at least one second slave latch operable to buffer store at least one second slave latch data bit; and
(d) an evaluation logic unit operable to output the configuration bit on the basis of the master latch data bit stored in the master latch, the first slave latch data bit stored in the first slave latch, and the at least one second slave latch data bit stored in the at least one second slave latch.

2. The shift register cell according to claim 1 wherein the at least one second slave latch comprises a single second slave latch.

3. The shift register cell according to claim 1, wherein the evaluation logic unit is operable to make an absolute majority decision on the basis of the master latch data bit, the first slave latch data bit and the second slave latch data bit in order to output the configuration bit.

4. The shift register cell according to claim 3 wherein the evaluation logic unit is operable to output the configuration bit said configuration bit having a particular logic value when at least two data bits selected from the master latch data bit, the first slave latch data bit and the second slave latch data bit have the particular logic value.

5. The shift register cell according to claim 1 wherein the evaluation logic unit is operable to output one of the data bits buffer stored in the first slave latch or at least one second slave latch as the configuration bit on the basis of a global control signal.

6. The shift register cell according to claim 1 wherein the evaluation logic unit is operable to output an error indicator bit when the master latch data bit, the first slave latch data bit and the at least one second slave latch data bit do not all have the same logic value.

7. The shift register cell according to claim 1 wherein a plurality of latches include the master latch, the first slave latch and the at least one second slave latch, and the evaluation logic unit is operable to output a correction bit to one of the plurality of latches whose buffer stored data bit is an erroneous data bit having a data bit value which differs from the data bit values of the buffer stored data bits in the other of the plurality of latches, wherein the correction bit output by the evaluation logic unit overwrites the erroneous data bit.

8. The shift register cell of claim 1 wherein a plurality of latches include the master latch, the first slave latch and the at least one second slave latch, and the evaluation logic unit is operable to output a correction bit to the master latch, the first slave latch and/or the at least one second slave latch when at least one buffer stored data bit in one of the plurality of latches has a data bit value which differs from the data bit values of the other buffer stored data bits in the other of the plurality of latches, and wherein the correction bit output by the evaluation logic unit corresponds to the configuration bit.

9. The shift register cell according to one of claim 1 wherein an output of the first slave latch is connected to a serial data output on the shift register cell.

10. The shift register cell according to claim 9 wherein the master latch, the first slave latch and the at least one second slave latch are static latches.

11. The shift register cell according to claim 1 wherein the first controllable switch, the second switch and/or the at least one third controllable switch are transmission gates.

12. The shift register cell according to claim 1 wherein the first controllable switch, the second controllable switch and/or the at least one third controllable switch are C2MOS gates.

13. The shift register cell according to claim 1 wherein the first controllable switch, the second controllable switch and/or the at least one third controllable switch are transistors.

14. The shift register cell according to claim 1 further comprising a multiplexer, the multiplexer comprising
a first input connected to the evaluation logic unit, the first input operable to receiving the configuration bit output from the evaluation logic unit,
a second input connected to the first slave latch,
at least one third input connected to the at least one second slave latch,
a fourth input operable to apply a constant, logic initialization value, and
a multiplexer output operable to output a signal received at one of the first, second, at least one third, or fourth inputs.

15. The shift register cell according to claim 14 wherein the multiplexer output is connected to a programming node in a configurable circuit.

16. The shift register cell according to claims 15 wherein the multiplexer is operable to be changed over between the first input, second input, at least one third input and the fourth input by a global control signal.

17. A shift register operable to safely provide a plurality of configuration bits, the shift register comprising:
a plurality of shift register cells connected in series to form a shift register chain, each of the plurality of shift register cells comprising
a data input,
a plurality of latches, each of the plurality of latches operable to store a data bit, wherein the plurality of latches include a master latch connected to the data input via a first controllable switch, a first slave latch connected to an output of the master latch via a second controllable switch, and at least one second slave latch connected to the output of the master latch via at least one third controllable switch, and
an evaluation logic unit operable to output one of the plurality of configuration bits on the basis of the data bits stored in the plurality of latches.

18. A shift register according to claim 17 wherein the evaluation logic unit is further operable to output an error indicator bit for each of the plurality of shift register cells, and the error indicator bits for the plurality of shift register cells are logically combined by an OR logic circuit and are output as a global error indicator bit.

19. The shift register according to claim 18 wherein the error indicator bits are read from the plurality of shift register cells by a data processing unit, and the data processing unit indicates that a bit error has occurred in one of the plurality of shift register cells.

20. The shift register according to claim 19 wherein the evaluation logic unit is operable to outputs a correction bit to one of the plurality of latches whose stored data bit is an erroneous data bit and the correction bit output by the evaluation logic unit overwrites the erroneous data bit, and wherein the data processing unit identifies a single bit error which has occurred temporarily when completed correction of the erroneous data bit by overwriting with the correction bit is followed by the error indicator bit being reset by the respective evaluation logic unit.

21. The shift register according to claim 20 wherein the data processing unit identifies a hardware error when completed correction of the erroneous data bit by overwriting with the correction bit is followed by the respective evaluation logic unit continuing to read an error indicator bit from the plurality of shift register cells.

22. The shift register according to claim 21 further comprising a plurality of first controllable switches, second controllable switches and third controllable switches, wherein the master latch is connected to the respective data input in each of the plurality of shift register cells by one of the plurality of first controllable switches, the first slave latch is connected to the master latch in each of the plurality of shift registers by one of the plurality of second controllable switches, and the at least one second slave latch is connected to the master latch in each of the plurality of shift registers by one of the plurality of third controllable switches; the shift register further comprising a shift register controller clocked by a clock signal, the shift register controller operable to actuate the plurality of first controllable switches, the plurality of second controllable switches, and the plurality of third controllable switches in the shift register cells on the basis of an operating phase control signal.

23. The shift register according to claim 22 wherein the shift register controller is operable to be switched between at least three different operating phases by the operating phase control signal.

24. The shift register according to claim 23 wherein a first write operating phase involves configuration data being written as data bits serially into the master latches and into the first slave latches in the plurality of shift register cells.

25. The shift register according to claim 23 wherein a second transfer operating phase involves the data bits which have been written to the master latches being written to the respective second slave latches.

26. The shift register according to claim 23 wherein a third provision operating phase involves the plurality of latches being isolated from one another, and the configuration bits which are output by the evaluation logic units in the plurality of shift register cells on the basis of the data bits which are stored in the plurality of latches in the respective shift register cell are output to programming nodes in a configurable circuit.

27. The shift register of claim 26 wherein the clock signal can be turned off in the third provision operating phase.

28. The shift register of claim 26 wherein the configurable circuit is an FPGA.

* * * * *